(12) United States Patent
Roy et al.

(10) Patent No.: US 11,069,568 B2
(45) Date of Patent: *Jul. 20, 2021

(54) ULTRA-THIN DIFFUSION BARRIERS

(71) Applicant: Applied Materials, Inc., Santa Clara, CA (US)

(72) Inventors: Susmit Singha Roy, Mountain View, CA (US); Yihong Chen, San Jose, CA (US); Abhijit Basu Mallick, Fremont, CA (US); Srinivas Gandikota, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/803,211

(22) Filed: Feb. 27, 2020

(65) Prior Publication Data

US 2020/0194307 A1 Jun. 18, 2020

Related U.S. Application Data

(63) Continuation of application No. 16/224,337, filed on Dec. 18, 2018, now Pat. No. 10,600,684.

(60) Provisional application No. 62/607,455, filed on Dec. 19, 2017.

(51) Int. Cl.
*H01L 21/768* (2006.01)
*H01L 21/02* (2006.01)
*H01L 21/3105* (2006.01)
*H01L 21/324* (2006.01)

(52) U.S. Cl.
CPC .... *H01L 21/76852* (2013.01); *H01L 21/0217* (2013.01); *H01L 21/0228* (2013.01); *H01L 21/0234* (2013.01); *H01L 21/02178* (2013.01); *H01L 21/02211* (2013.01); *H01L 21/02274* (2013.01); *H01L 21/02315* (2013.01); *H01L 21/31053* (2013.01); *H01L 21/324* (2013.01); *H01L 21/76864* (2013.01)

(58) Field of Classification Search
CPC .......... H01L 21/0217; H01L 21/02178; H01L 21/02211; H01L 21/02274; H01L 21/0228; H01L 21/02315; H01L 21/0234; H01L 21/31053; H01L 21/324; H01L 21/76852; H01L 21/76864; B41J 2/17513
USPC ....... 438/530, 692, 693, 696, 699, 700, 702, 438/780
See application file for complete search history.

(56) References Cited

U.S. PATENT DOCUMENTS

| | | |
|---|---|---|
| 7,718,548 B2 | 5/2010 | Lee et al. |
| 7,727,883 B2 | 6/2010 | Ishizaka et al. |
| 8,058,728 B2 | 11/2011 | Ishizaka et al. |
| 8,877,655 B2 | 11/2014 | Shero et al. |
| 9,418,889 B2 | 8/2016 | Mountsier et al. |
| 9,892,961 B1 | 2/2018 | Cheng et al. |
| 10,043,709 B2 | 8/2018 | Ai et al. |
| 10,283,353 B2 | 5/2019 | Kobayashi et al. |

(Continued)

*Primary Examiner* — Lan Vinh
(74) *Attorney, Agent, or Firm* — Patterson + Sheridan, LLP

(57) ABSTRACT

In one embodiment, a method of forming a barrier layer is provided. The method includes positioning a substrate in a processing chamber, forming a barrier layer over the substrate and in contact with the underlayer, and annealing the substrate. The substrate comprises at least one underlayer having cobalt, tungsten, or copper. The barrier layer has a thickness of less than 70 angstroms.

18 Claims, 2 Drawing Sheets

(56) References Cited

U.S. PATENT DOCUMENTS

| | | | |
|---|---|---|---|
| 10,600,684 B2* | 3/2020 | Roy | H01L 21/31053 |
| 2005/0020080 A1 | 1/2005 | Chiang et al. | |
| 2008/0020591 A1* | 1/2008 | Balseanu | H01L 29/66583 |
| | | | 438/761 |
| 2009/0246952 A1 | 10/2009 | Ishizaka et al. | |
| 2016/0049331 A1* | 2/2016 | Naik | H01L 23/5329 |
| | | | 438/613 |
| 2016/0071757 A1* | 3/2016 | Tsai | H01L 21/02271 |
| | | | 438/400 |

* cited by examiner

ULTRA-THIN DIFFUSION BARRIERS

CROSS-REFERENCE TO RELATED APPLICATIONS

This application is a continuation of U.S. Nonprovisional patent application Ser. No. 16/224,337, filed Dec. 18, 2018, which claims benefit of U.S. Provisional Patent Application Ser. No. 62/607,455, filed Dec. 19, 2017, which are both herein incorporated by reference in their entirety.

BACKGROUND

Field

Embodiments of the present disclosure generally relate to diffusion barriers for semiconductor devices.

Description of the Related Art

A conventional integrated circuit contains a plurality of metal pathways that provide electrical power to the various semiconductor devices forming the integrated circuit and that allow these semiconductor devices to share and exchange electrical information. Within the integrated circuits, metal layers are stacked on top of one another by using inter-metal or "interlayer" dielectrics that insulate the metal layers from each other.

Generally, each metal layer forms electrical contact to at least one other metal layer. Such metal-layer-to-metal-layer electrical contact is achieved by etching a hole (e.g., a via) in the interlayer dielectric that separates the metal layers, and by filling the resulting via with a metal to create an interconnect. Metal layers typically occupy etched pathways, or "lines", in the interlayer dielectric.

Diffusion barriers typically prevent intermixing of materials, oxidation of the under-layer, and penetration of moisture in the under-layer. Due to an ever decreasing size of integrated circuits, the space on the integrated circuit is increasingly limited. However, many of the current diffusion barriers have decreased performance with decreased thickness. Thus, achieving adequate barrier layer performance in high aspect ratio features or other space-limited features is challenging.

Accordingly, what is needed in the art are improved diffusion barrier layers and methods of forming the same.

SUMMARY

In one embodiment, a method of forming a barrier layer is provided. The method includes positioning a substrate in a processing chamber, forming a barrier layer over the substrate and in contact with the underlayer, and annealing the substrate. The substrate comprises at least one underlayer having cobalt, tungsten, or copper. The barrier layer has a thickness of less than 70 angstroms.

In one embodiment, a method of forming a semiconductor device is provided. The method includes positioning a device intermediate in a processing chamber. The device intermediate includes a silicon substrate, a dielectric layer, and conductive features in contact with the silicon substrate and extending through the dielectric layer. The method further includes forming a barrier layer over the device intermediate, depositing a gap fill material on the barrier layer, removing a portion of the gap fill material, and annealing the device intermediate at a temperature of about 400° C. to about 500° C. and a pressure of about 10 torr to about 700 torr.

In one embodiment, a method of forming a semiconductor device is provided. The method includes positioning a device intermediate in a processing chamber, forming a barrier layer over the device intermediate, depositing a gap fill material on the barrier layer, planarizing an upper surface of the device intermediate, and annealing the device intermediate. The barrier layer has a thickness of no more than 70 angstroms.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of this disclosure. As will be apparent to those skilled in the art, however, various changes using different configurations may be made without departing from the scope of this disclosure. In other instances, well-known features have not been described in order to avoid obscuring this material. Thus, this disclosure is not considered limited to the particular illustrative embodiments shown in the specification and all such alternate embodiments are intended to be included in the scope of the appended claims.

Figure 1:
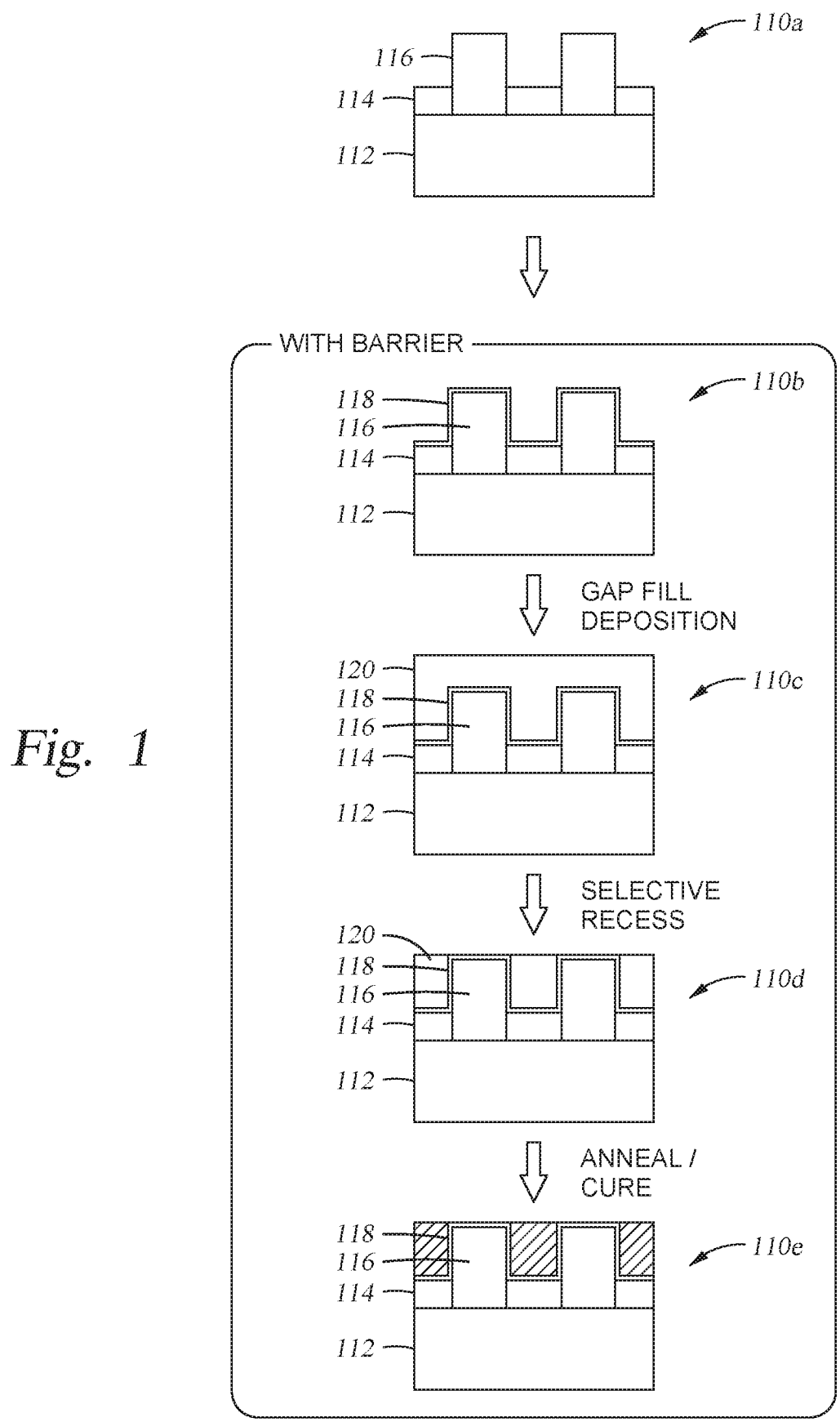
FIG. 1 schematically illustrates operations during device formation, according to one embodiment of the disclosure.
Figure 2:
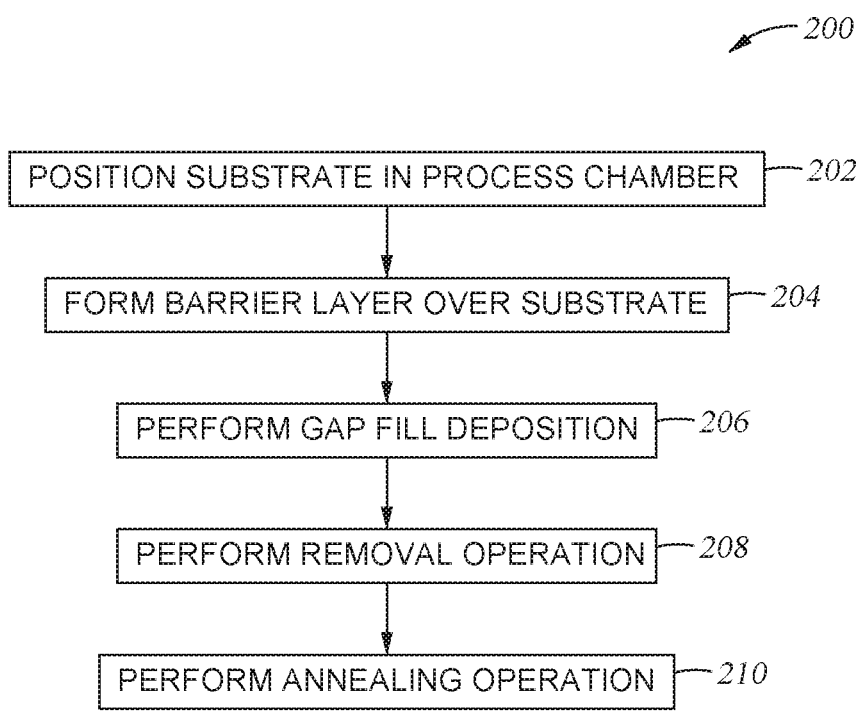
FIG. 2 illustrates a flow diagram of a method corresponding to FIG. 1.

There is a need for a barrier layer that prevents diffusion of metals and protects against penetration of oxygen and moisture. However, due to ever-shrinking feature dimensions, formation of a barrier that is conformal and sufficiently thick to perform adequately is difficult. In addition, conventional diffusion barriers typically include an adhesion layer for adequate adherence to immediately adjacent metal layers. The thickness of the adhesion layer occupies space that could be occupied by the diffusion barrier. Moreover, the thickness of the adhesion layer is not conducive to high aspect ratio features. In conventional examples, the combination of an adhesion layer and barrier layer is about 70 angstroms in thickness, thus limiting feature sizes in which conventional barrier layers and adhesion layers may be used. To compensate for feature size, the conventional barrier may be formed with a reduced thickness, but at a cost of reduced performance. FIG. 1 schematically illustrates operations during device formation, according to one embodiment of the disclosure. FIG. 2 illustrates a flow diagram of a method corresponding to FIG. 1. To facilitate explanation, FIG. 1 and FIG. 2 are discussed in conjunction with one another.

Method 200 begins at operation 202, in which a device intermediate 110a is positioned in a process chamber, such as a deposition chamber. The device intermediate 110a is utilized to form a semiconductor device, such as an integrated circuit. The term "device intermediate" is used herein to indicate an unfinished or incomplete device, e.g., as the device would appear during various processing operations prior to completion of the finished device. The device intermediate 110a includes a silicon substrate 112 having a dielectric layer 114, such as silicon oxide, disposed on an upper surface thereof. Conductive features 116, such as metal interconnect lines, for example copper, are also in contact with the substrate 112 and extend through openings formed in the dielectric layer 114 to a height above the dielectric layer 114. In some embodiments, the device intermediate 110a includes one or more underlayers (not shown) disposed on the upper surface of the silicon substrate 112. The underlayer may be formed of copper, cobalt, tungsten, or other suitable materials, and may have openings formed therein to enable the conductive features 116 to extend therethrough.

In operation 204, a barrier layer 118 is formed over the device intermediate 110a, resulting in a device intermediate 110b. The barrier layer 118 is formed on exposed surfaces of the dielectric layer 114 as well as exposed surfaces of the conductive features 116. In operation 206, a gap fill operation is performed on the device intermediate 110b to deposit a gap fill material 120, resulting in device intermediate 110c. The gap fill material 120 is a flowable dielectric material, such as flowable silicon dioxide deposited by chemical vapor deposition. It is also contemplated that other suitable deposition processes may be used to deposit the gap fill material 120.

Subsequently, in operation 208, a removal operation is performed to remove a portion of the previously-deposited gap fill material 120, resulting in device intermediate 110d. In operation 208, an upper portion of the gap fill material 120 is removed to planarize an upper surface thereof, resulting in device intermediate 110d. The gap fill material 120 is removed through selective etching or polishing (e.g., chemical mechanical polishing), until the upper portion of the gap fill material 120 is about co-planar with an upper portion of the conductive features 116.

In operation 210, the device intermediate 110d is annealed to form the device intermediate 110e. The annealing is performed to facilitate one or more of dopant activation, crystal repair, or the like. Annealing occurs at a temperature within a range of about 350° C. to about 550° C., at a pressure of about 6.5 torr to about 1 atmosphere, for a time of up to 8 hours. For example, annealing is performed at a temperature within the range of about 400° C. to about 500° C., such as about 425° C. to about 475° C. In another example, which may be combined with other examples described herein. annealing is performed at a pressure of about 10 torr to about 700 torr, such as about 50 torr to about 500 torr. However, it is to be noted that other annealing parameters are contemplated depending on specific device applications and structures.

The presence of the barrier layer 118 during operation 210 prevents or substantially reduces oxidation of the conductive features 116 by adjacent oxide materials, such as the gap fill material 120. Similarly, the presence of barrier layer 118 during operation 210 prevents or substantially reduces inter-diffusion of electrically conductive metal particles from the conductive features 116 to the gap fill material 120. Thus, device integrity is maintained and device performance is improved.

FIG. 1 and FIG. 2 illustrate one embodiment of forming a device; however, other embodiments are also contemplated. For example, it is contemplated that the substrate 112 may be formed from a material other than silicon. For example, the substrate 112 may be formed of germanium, silicon germanium, transparent conductive oxides (TCO), and the like. Additionally, it is contemplated that the dielectric layer 114 and the gap fill material 120 may be a material other than silicon oxide, such as silicon nitride, silicon oxynitride, carbon-doped silicon oxide, or other low k materials.

It is also contemplated that conductive materials other than copper may be utilized for the formation of conductive features 116. Such conductive materials include aluminum, gold, platinum, palladium, cobalt, tungsten, titanium, silver, and electrically conductive compounds or alloys thereof. Moreover, it is contemplated that the barrier layer 118 may be applied to materials other than metal interconnects, such as plugs, contacts, and the like. Additionally, it is contemplated that barrier layer 118 disclosed herein may not be incorporated into final device structures, but instead, may be removed from a device during intermediate processes.

It is also to be noted that the device intermediates 110a-110e are shown only as one embodiment, and are not intended to be limiting of applications of the disclosed barrier layers. Other devices, and the intermediate device structures used to form such devices, are intended to benefit from aspects of the disclosure. In one example, the barrier layers disclosed herein are advantageous to self-aligned vias and fully self-aligned vias.

In one embodiment, a barrier layer 118 including a silicon nitride layer is deposited over a cobalt underlayer. The silicon nitride barrier layer is deposited by atomic layer deposition (ALD) in an OLYMPIA® chamber available from Applied Materials, Inc. of Santa Clara, Calif. However, other chambers, including those from other manufacturers, are also contemplated.

In such an example, a substrate, such as silicon substrate 112, is maintained at a predetermined temperature within a range of about 250° C. to about 550° C., such as about 350° C. to about 450° C., such as about 400° C., and rotated on a rotating support during the barrier layer formation process. Once the substrate is elevated to a predetermined temperature, the substrate is exposed to the pretreatment process of ionized and/or radicalized ammonia gas. The ionized and/or radicalized ammonia gas is delivered to the process chamber at a flow rate between about 100 sccm and about 200 sccm, such as about 150 sccm. Argon is also delivered to the process chamber at a flow rate between about 2500 sccm and about 3500 sccm, such as about 3000 sccm. The ammonia and argon are radicalized and/or ionized in a remote plasma source, or in-situ within the processing chamber, or a combination thereof, at an RF plasma power within a range of about 50 W to about 75 W, such as about 65 W. During the pretreatment process, the pressure within the process chamber is maintained within a range of about 5 torr to about 10 torr, such as about 6.5 torr, and the substrate is exposed for a time of about 30 seconds to about 5 minutes, such as about 60 seconds. The pretreatment gas minimizes the effects of halogens on exposed dielectric and/or metal surfaces on the substrate, including undesired etching or halide-doping due to the presence of halogens/halides.

After exposure of the substrate to the pretreatment gas, the substrate is exposed cyclically to a first precursor gas including ammonia (NH$_3$) and a second precursor gas including dichlorosilane (DCS). The precursor gases are co-flowed with a carrier gas, such as argon, helium, or nitrogen, to facilitate flow of the precursor gases to the processing chamber. The ammonia is delivered to the process chamber at a flow rate between about 500 sccm to about 1000 sccm, such as about 700 sccm. The DCS is delivered to the process chamber at a flow rate of about 600 sccm to about 1000 sccm, such as about 800 sccm. The carrier gas, such as argon, is delivered to the process chamber at a flow rate of about 2500 sccm to about 3500 sccm, such as about 3000 sccm. Optionally, diatomic nitrogen may be additionally co-flowed with the above gases at a flow rate of about 250 sccm to about 350 sccm, such as 300 sccm. During the deposition process, the pressure within the processing chamber is maintained within a range of about 5 torr to about 10 torr, such as about 6.5 torr.

During the cyclical deposition process, the ammonia gas is radicalized and/or ionized in a remote plasma source to generate charged species (e.g., ions and/or radicals), and is subsequently provided to the processing chamber. The generation of charged species facilitates reaction of precursor gases to form a silicon nitride layer on the surface of the substrate. The ammonia is radicalized and/or ionized in a remote plasma source, or in-situ within the processing chamber, or a combination thereof, at an RF plasma power within a range of about 50 W to about 75 W, such as about 65 W, and a frequency of about 13.56 MHz. The cyclical exposure of the substrate 112 to the precursor gases is repeated until a silicon nitride layer of desired thickness is formed.

In one embodiment, the silicon nitride formation process also includes an optional mid-deposition soak. When utilizing a mid-deposition soak, a cyclical deposition process is performed as described above to form a first portion of a silicon nitride layer, followed by performance of a mid-treatment soak, and then the cyclical deposition process is continued to form a second portion of the silicon nitride layer. In one such example, the first portion and the second portion are of equal thickness. For example, the first portion and the second portion are within a range of about 8 angstroms each to about 30 angstroms each, such as about 10 angstroms to about 20 angstroms each, such as about 13 angstroms each.

The mid-deposition soak is a nitridation treatment which facilitates nitridation of the deposited film. Utilization of the mid-deposition treatment provides nitridation of earlier-deposited portions (e.g., the first portion) of the silicon nitride layer, which may not be adequately nitridized using a post-deposition treatment alone. Specifically, nitridation facilitates achievement of a stoichiometric ratio of the deposited silicon nitride film, thus eliminating unreacted Si bonds or Si—Cl bonds that can easily react with oxygen when exposed to ambient air. In the absence of nitridation, the unreacted Si bonds or Si—Cl bonds react with oxygen to form SiO$_x$, oxidizing the barrier layer. In addition, nitridation densifies the deposited layer, improving the barrier properties of the barrier layer 118. In one embodiment, the nitridation process is performed under the same process conditions as the pretreatment process.

After the silicon nitride layer is deposited to a desired thickness by depositing the first portion and the second portion, a post-deposition treatment is performed. The post deposition treatment is the same as the mid-deposition treatment, and facilitates nitridation of the second portion of the silicon nitride film, e.g., nitridation of portions of the barrier layer 118 deposited after the mid-deposition treatment. According to one embodiment, silicon nitride films provide conformal barrier layers with adequate barrier properties, particularly on cobalt underlayers. In such an embodiment, diffused oxygen levels post-anneal are below electron energy-loss spectroscopy (EELS) detection limits.

While the above embodiment is described as having a silicon nitride layer formed of two portions (e.g., a first portion and a second portion), it is contemplated that the silicon nitride layer may be formed in more than two portions and may include a mid-deposition treatment between each portion. In some embodiments, the silicon nitride portions of the barrier layer 118 may not have the same thickness as one another. In one example, the silicon nitride layer is conformal, with a step coverage exceeding 90 percent, such as 95 percent or 98 percent.

In another embodiment of the barrier layer 118, which may be combined with other embodiments described herein, an amorphous silicon layer is deposited by plasma-enhanced chemical vapor deposition (PECVD). The amorphous silicon layer is formed by reaction of silane and/or disilane with hydrogen (e.g., diatomic hydrogen). The amorphous silicon layer is formed while maintaining the substrate at a temperature within a range of about 350° C. to about 450° C., such as about 400° C. The process chamber is maintained at a pressure within a range of about 2 to about 40 torr, such as about 3 to about 7 torr, while applying RF power at a frequency of about 13.56 MHz and a power of about 400 W to about 600 W, such as about 500 W, to generate a plasma from the processing gases.

When the above-described amorphous silicon layer is deposited on a tungsten underlayer, the amorphous silicon layer prevents or substantially reduces metal oxidation and interdiffusion (e.g., resistivity of the tungsten layer is unchanged after annealing, and the potentially-diffusing species are below the EELS detection limit) when having a thickness of at least 20 angstroms, such as 20 angstroms to 50 angstroms, for example, about 30 angstroms. However, when the above-described amorphous silicon layer is deposited on a cobalt or copper underlayer, the amorphous silicon layer undesirably forms silicides during annealing, thus affecting device performance by increasing resistivity.

In another embodiment of the barrier layer 118, which may be combined with other embodiments described herein, an amorphous silicon nitride barrier layer is deposited by PECVD. The amorphous silicon nitride barrier layer is formed by reacting silane with diatomic hydrogen in the presence of diatomic nitrogen. The deposition occurs at a temperature between about 350° C. to about 450° C., such as about 400° C. The pressure within the processing chamber is maintained within a range of about 2 torr to about 40 torr. In one embodiment, the flow rate of silane is within a range of about 40 sccm to about 60 sccm, such as about 50 sccm. The hydrogen flow rate is within a range of about 400 sccm to about 600 sccm, such as about 500 sccm. The nitrogen flow rate is within a range of about 1500 sccm to about 2500 sccm. An inert gas, such as argon, may be utilized at a flow rate of about 2500 sccm to about 3500 sccm to facilitate of flow of precursor gases or to facilitate establishment of plasma within the processing chamber. Such plasma is generated using a 500 W RF power at a frequency of 13.56 MHz.

In one application, the amorphous silicon nitride barrier layer described above is deposited on a tungsten underlayer. When deposited to a thickness of about 20 angstroms to about 60 angstroms, such as about 20 angstroms to about 40 angstroms or 30 angstroms to 50 angstroms, for example 20 angstroms or 30 angstroms, the amorphous silicon nitride barrier layer prevents or substantially reduces metal oxidation and interdiffusion.

In another application, the amorphous silicon nitride barrier layer described above is deposited on a cobalt underlayer. The amorphous silicon nitride layer prevents or substantially reduces metal oxidation and interdiffusion when having a thickness as low as 30 angstroms, such as about 30 angstroms to about 60 angstroms. Similar results may be achieved when depositing the amorphous silicon nitride barrier layer on a copper underlayer.

In another embodiment of the barrier layer 118, which may be combined with other embodiments described herein, an aluminum oxide barrier layer is deposited by ALD. The aluminum oxide barrier layer is deposited by sequentially exposing a substrate to trimethylaluminum (TMA) and water, while maintaining the substrate at a temperature within a range of about 300° C. to about 400° C. In such an example, the aluminum oxide barrier layer is formed using a TMA flow rate of about 400 sccm to about 600 sccm, a water flow rate of about 400 sccm to about 600 sccm, and an optional carrier gas flow with either or both the TMA and water. In one example, the carrier gas is argon at a flow rate of about 800 sccm to about 1200 sccm. In certain embodiments, the substrate is rotated during the ALD process.

In one application, the above-described aluminum oxide barrier layer is conformally deposited on a tungsten underlayer. The aluminum oxide barrier layer prevents or substantially reduces metal oxidation and interdiffusion when having a thickness of 50 angstroms or greater, such as about 50 angstroms to about 60 angstroms.

In another application, the above-described aluminum oxide barrier layer is conformally deposited on a cobalt underlayer. The aluminum oxide barrier layer prevents or substantially reduces metal oxidation and interdiffusion when having a thickness of 20 angstroms or greater, such as about 20 angstroms to about 60 angstroms, for example, 20 angstroms to 30 angstroms.

The disclosed barrier layers may be deposited in various chambers, such as those available from Applied Materials, Inc. of Santa Clara, Calif. Exemplary chambers include OLYMPIA®, PRECISION™, and PRODUCER®, however, other chambers, including those from other manufacturers, may be utilized.

Aspects of the disclosure relate to the deposition of barrier layers which do not utilize adhesive layers, and which suitably prevent metal oxidation and interdiffusion at thicknesses less than 70 angstroms, such as less than 30 angstroms, while maintaining conformality. Because the disclosed barrier layers do not utilize adhesive layers, the barrier layers have reduced thickness, and thus are advantageous for high aspect ratio applications.

The above-described barrier layers enable adhesion layers to be omitted due to the barrier layers adhering to both underlayers as well as materials subsequently deposited thereon. Conventionally, the metal material that is deposited adjacent conventional barrier layers, such as underlying metal features or subsequently grown columns utilize a halogen-based precursor. Such metal materials do not adhere well to conventional barrier layers. To overcome this problem, TiN, TaN, TiSiN, TaSiN are conventionally used as an adhesion layer. However, these adhesion layers do not serve as an oxygen barrier, since these conventional adhesion layers react with oxygen to form respective oxides. Hence, conventionally, the addition of a second (e.g., oxygen barrier) layer which blocks oxygen is utilized. As described above, this multi-layer approach has limited applicability with high-aspect ratio features due to the total thickness of the multiple layers. In contrast, aspects of the present disclosure utilize a single-layer barrier, which functions as both an adhesive layer for subsequently deposited metal materials, as well as a barrier layer for oxygen or metal diffusion.

While the foregoing is directed to embodiments in this disclosure, other and further embodiments may be devised without departing from the basic scope thereof, and the scope thereof is determined by the claims that follow.

We claim:

1. A method of forming a semiconductor device, comprising:
   positioning a device intermediate in a process chamber, the device intermediate including a dielectric layer disposed on a substrate and conductive features in contact with the substrate and extending through the dielectric layer;
   depositing a silicon nitride barrier layer having a thickness of less than 70 angstroms on exposed surfaces of the dielectric layer and the conductive features via atomic layer deposition, the substrate maintained at a temperature of about 250° C. to about 550° C. during deposition of the barrier layer, wherein the barrier layer is formed of at least two portions, each portion formed by a separate deposition process; and
   annealing the device intermediate having the barrier layer thereon at a temperature of about 350° C. to about 550° C. and a pressure of about 6.5 torr to about 760 torr.

2. The method of claim 1, wherein the barrier layer has a thickness of less than 30 angstroms.

3. The method of claim 1, wherein the deposition of silicon nitride comprises a pretreatment process, the pretreatment process comprising:
   exposing the device intermediate to ionized or radicalized ammonia gas and argon gas at a pressure of about 5 torr to about 10 torr.

4. The method of claim 1, wherein the at least two portions have different thicknesses.

5. The method of claim 1, wherein the barrier layer is conformal and has a step coverage greater than 90 percent.

6. The method of claim 1, wherein the deposition of the barrier layer comprises a mid-deposition soak between the formation of the at least two portions of the barrier layer.

7. The method of claim 6, wherein the mid-deposition soak is a nitridation treatment of a first portion of the barrier layer.

8. The method of claim 1, wherein the deposition of the barrier layer further comprises a post-deposition treatment.

9. The method of claim 8, wherein the post-deposition treatment is a nitridation treatment of the barrier layer.

10. The method of claim 1, further comprising:
    depositing a flowable gap fill material on the barrier layer;
    planarizing an upper surface of the gap fill material.

11. The method of claim 10, wherein the flowable gap fill material is selected from the group consisting of silicon oxide, silicon nitride, silicon oxynitride, and carbon-doped silicon oxide.

12. A method of forming a semiconductor device, comprising:
    positioning a device intermediate in a process chamber, the device intermediate including at least one dielectric layer disposed on a substrate and conductive features in contact with the substrate and extending through openings in the at least one dielectric layer;
    depositing a silicon nitride barrier layer over the device intermediate via atomic layer deposition, wherein the barrier layer is formed of two or more portions, each portion formed by a separate deposition process;

depositing a gap fill material on the barrier layer, the gap fill material comprising a flowable dielectric material; and annealing the device intermediate having the barrier layer thereon at a temperature of about 400° C. to about 500° C.

13. The method of claim 12, wherein the barrier layer has a thickness of less than 30 angstroms.

14. The method of claim 12, wherein the two or more portions have different thicknesses.

15. The method of claim 12, further comprising a nitridation treatment after formation of at least one portion of the barrier layer.

16. The method of claim 12, wherein the deposition of barrier layer comprises a pretreatment process, the pretreatment process comprising:

exposing the device intermediate to ionized or radicalized ammonia gas and argon gas at a pressure of about 5 torr to about 10 torr.

17. The method of claim 16, wherein the deposition of barrier layer further comprises maintaining the substrate at a temperature of about 250° C. to about 550° C.

18. A method of forming a semiconductor device, comprising:

positioning a device intermediate in a process chamber, the device intermediate including a dielectric layer disposed on a substrate and conductive features in contact with the substrate and extending through openings in the dielectric layer;

depositing a first portion of a silicon nitride barrier layer over the device intermediate via atomic layer deposition;

performing a mid-deposition soak, the mid-deposition soak comprising a nitridation treatment;

depositing a second portion of the silicon nitride barrier layer over the device intermediate, the second portion and the first portion of the silicon nitride barrier layer each having a thickness within a range of about 8 angstroms to about 30 angstroms;

performing a post-deposition treatment, the post-deposition treatment comprising a nitridation treatment;

depositing a gap fill material on the silicon nitride barrier layer, the gap fill material comprising a flowable dielectric material; and removing a portion of the gap fill material to planarize an upper surface of the device intermediate.

* * * * *